(12) United States Patent
Chang et al.

(10) Patent No.: US 9,741,804 B2
(45) Date of Patent: Aug. 22, 2017

(54) THIN FILM TRANSISTOR SUBSTRATE AND DISPLAY PANEL HAVING FILM LAYER WITH DIFFERENT THICKNESSES

(71) Applicant: InnoLux Corporation, Jhu-Nan, Miao-Li County (TW)

(72) Inventors: Jung-Fang Chang, Jhu-Nan (TW); I-Ho Shen, Jhu-Nan (TW)

(73) Assignee: INNOLUX CORPORATION, Jhu-Nan, Miao-Li County (TW)

( * ) Notice: Subject to any disclaimer, the term of this patent is extended or adjusted under 35 U.S.C. 154(b) by 0 days.

(21) Appl. No.: 14/935,808

(22) Filed: Nov. 9, 2015

(65) Prior Publication Data
US 2016/0141426 A1 May 19, 2016

(30) Foreign Application Priority Data
Nov. 14, 2014 (TW) .............................. 103139649 A

(51) Int. Cl.
*H01L 29/10* (2006.01)
*H01L 29/417* (2006.01)
*H01L 29/786* (2006.01)

(52) U.S. Cl.
CPC .... *H01L 29/41733* (2013.01); *H01L 29/7869* (2013.01); *H01L 29/78606* (2013.01); *H01L 29/78696* (2013.01)

(58) Field of Classification Search
CPC .... H01L 29/786; H01L 29/417; H01L 29/423
USPC .......................................................... 257/43
See application file for complete search history.

(56) References Cited

U.S. PATENT DOCUMENTS

| | | | | |
|---|---|---|---|---|
| 8,558,230 B2 * | 10/2013 | Lee | ..................... | H01L 27/1214 257/49 |
| 2009/0174835 A1 * | 7/2009 | Lee | ........................ | G02F 1/1368 349/46 |
| 2009/0321732 A1 * | 12/2009 | Kim | .................. | H01L 29/78606 257/43 |
| 2010/0044699 A1 * | 2/2010 | Chung | .............. | H01L 29/78618 257/43 |
| 2010/0295047 A1 * | 11/2010 | Moriguchi | ........ | H01L 29/66757 257/57 |
| 2011/0147756 A1 * | 6/2011 | Moriguchi | ........ | H01L 29/78609 257/60 |
| 2011/0240987 A1 * | 10/2011 | Lee | ................... | H01L 29/78648 257/43 |
| 2011/0240990 A1 * | 10/2011 | Yamazaki | ........... | H01L 29/7869 257/43 |

(Continued)

FOREIGN PATENT DOCUMENTS

| | | |
|---|---|---|
| CN | 1941299 A | 4/2007 |
| TW | 201342491 A | 10/2013 |

*Primary Examiner* — Caleb Henry
(74) *Attorney, Agent, or Firm* — Muncy, Geissler, Olds & Lowe, P.C.

(57) ABSTRACT

A thin film transistor (TFT) substrate includes a substrate and a TFT. The TFT is disposed on the substrate and comprises a gate, a gate dielectric layer, a film, a source and a drain. The gate is disposed on the substrate. The gate dielectric layer is disposed on the gate and the substrate. The film is disposed above the gate dielectric layer, and the source and the drain are disposed on the film and contacts with the film respectively. Wherein, there is an interval between the source and the drain, and the film corresponding to the interval has an arc concave portion. In addition, a display panel is also disclosed.

7 Claims, 6 Drawing Sheets

(56) References Cited

U.S. PATENT DOCUMENTS

| | | | | |
|---|---|---|---|---|
| 2011/0240992 A1* | 10/2011 | Yamazaki | ........... | H01L 27/1225 257/43 |
| 2012/0087460 A1* | 4/2012 | Moriwaki | ........... | H01L 27/0255 377/64 |
| 2012/0138922 A1* | 6/2012 | Yamazaki | ........... | H01L 29/7869 257/43 |
| 2012/0313084 A1* | 12/2012 | Tsai | ................. | H01L 29/78606 257/40 |
| 2013/0009149 A1* | 1/2013 | Endo | .................. | H01L 27/1218 257/43 |
| 2013/0075722 A1* | 3/2013 | Yamazaki | ......... | H01L 29/41733 257/43 |
| 2013/0087802 A1* | 4/2013 | Kohno | .............. | H01L 29/66765 257/72 |
| 2013/0207103 A1* | 8/2013 | Lee | .................. | H01L 29/66742 257/43 |
| 2013/0207104 A1* | 8/2013 | Lee | .................... | H01L 29/7869 257/43 |
| 2014/0203274 A1* | 7/2014 | Tseng | .................... | G02F 1/1368 257/43 |
| 2014/0204305 A1* | 7/2014 | Tseng | ................ | H01L 29/66969 349/46 |
| 2014/0239293 A1* | 8/2014 | Yamazaki | ............... | H01L 29/78 257/43 |
| 2014/0252345 A1* | 9/2014 | Tsubuku | ........... | H01L 21/02488 257/43 |
| 2014/0361287 A1* | 12/2014 | Shieh | ................ | H01L 29/78633 257/43 |
| 2015/0028327 A1* | 1/2015 | Kim | .................... | H01L 27/1255 257/43 |
| 2015/0194450 A1* | 7/2015 | Gao | .................. | H01L 29/66765 257/66 |

\* cited by examiner

THIN FILM TRANSISTOR SUBSTRATE AND DISPLAY PANEL HAVING FILM LAYER WITH DIFFERENT THICKNESSES

CROSS REFERENCE TO RELATED APPLICATIONS

This Non-provisional application claims priority under 35 U.S.C. §119(a) on Patent Application No(s). 103139649 filed in Taiwan, Republic of China on Nov. 14, 2014, the entire contents of which are hereby incorporated by reference.

BACKGROUND

Technical Field

The invention relates to a thin film transistor substrate and a display panel having the thin film transistor substrate.

Related Art

As the progressive of technology, flat display panels are widely applied to various fields. Because it has advantages of compact volume, low power consumption, and non-radiation, it gradually replaces traditional CRT (cathode ray tube) display device and applies to various electronic products, for example, mobile phone, portable multimedia device, notebook computer, LCD (liquid crystal display) TV or LCD monitor, etc.

Taking liquid crystal display panel for example, a conventional liquid crystal display panel includes a thin film transistor (TFT) substrate, a color filter substrate and a liquid crystal layer. The TFT substrate and the color filter substrate are disposed oppositely, and the liquid crystal layer is sandwiched between the TFT substrate and the color filter substrate. Herein, the TFT substrate has a plurality of thin film transistors and a plurality of pixel electrodes disposed on a substrate, and pixel data are input to these pixel electrodes by controlling the thin film transistors. Accordingly, it controls the liquid crystal molecules of liquid crystal layer to steer and thus displaying the image.

Due to drastic competition in the market, demands of size and display color saturation of the display panel and display device are also rapidly grown. The electrical characteristics and stability of TFT are also urged. Herein, the thin film transistor (hereinafter TFT) based on the metal oxide (Metal oxide-based, MOSs) as the material of the semiconductor layer can be manufactured at room temperature, and it is beneficial to good current output characteristics, low leakage current and electron mobility higher than ten times of that of the amorphous silicon TFT (a-Si TFT). It respectively reduces the power consumption of the display panel and to enhance the display panel of the operating frequency. Therefore, it becomes the major driving element utilized in next generation display panel and apparatus.

However, the metal oxide semiconductor (MOS) layer has better electrical properties, but during manufacturing TFT, when the source or drain of TFT employs metal layer containing aluminum in form of single layer or multiple layers (e.g., multiple metal layers of molybdenum nitride/aluminum/molybdenum nitride) and they are patterned by wet etching, the reaction product by etching causes damages on the channel layer of the oxide semiconductor after subsequent heat processes. Referring to FIG. 1, the initial voltage of TFT is offset from the normal curve C1 to negative bias curve C2. Therefore, it influences the operation reliability of TFT device and further influences the reliability of the display panel.

Therefore, it is an important subject to provide a TFT substrate and its display panel which have better device reliability and improved product yield.

SUMMARY

An objective of the invention is to provide a TFT substrate and its display panel which have better device reliability and improved product yield.

To achieve the above objective, a TFT substrate according to the invention includes a substrate and a TFT. The TFT is disposed on the substrate and has a gate, a gate dielectric layer, a film layer, a source and a drain. The gate is disposed on the substrate, the gate dielectric layer is disposed on the gate, the film layer is disposed on the gate dielectric layer, the source and the drain are disposed on the film layer, and the source and the drain contact with the film layer, respectively. There is an interval between the source and the drain, and the film layer corresponding to the interval has an arc concave portion.

To achieve the above objective, a display panel according to the invention includes a TFT substrate and an opposite substrate. The TFT substrate includes a substrate and a TFT. The TFT is disposed on the substrate and has a gate, a gate dielectric layer, a film layer, a source and a drain, the gate is disposed on the substrate, the gate dielectric layer is disposed on the gate, the film layer is disposed on the gate dielectric layer, the source and the drain are disposed on the film layer, and the source and the drain contact with the film layer, respectively. There is an interval between the source and the drain, and the film layer corresponding to the interval has an arc concave portion. The opposite substrate is disposed oppositely to the TFT substrate.

In one embodiment, the film layer acts an etching stop layer of the TFT, the TFT further includes a channel layer, the material of the channel layer is MOS disposed on the gate dielectric layer, and the etching stop layer is disposed on the channel layer.

In one embodiment, the drain and the source contact with the channel layer respectively through an opening of the etching stop layer.

In one embodiment, a first thickness represents a thickness of peripheral region of the etching stop layer corresponding to the interval, a second thickness represents a thickness of a middle region of the etching stop layer corresponding to the interval, and the first thickness is thicker than the second thickness.

In one embodiment, a contact region exists between the source/drain near the arc concave portion and the etching stop layer, a third thickness represents a thickness of the etching stop layer located at the contact region near the arc concave portion, and the third thickness is thicker than the first thickness.

In one embodiment, the difference between the third thickness and the second thickness is between 20 Å and 500 Å.

In one embodiment, the film layer acts as a channel layer of the TFT, and the material of the channel layer is MOS.

In one embodiment, a first thickness represents a thickness of peripheral region of the channel layer corresponding to the interval, a second thickness represents a thickness of a middle region of the channel layer corresponding to the interval, and the first thickness is thicker than the second thickness.

In one embodiment, a contact region exists between the source/drain near the arc concave portion and the channel layer, a third thickness represents a thickness of the channel layer located at the contact region near the arc concave portion, and the third thickness is thicker than the first thickness.

In one embodiment, the difference between the third thickness and the second thickness is between 50 Å and 300 Å.

In summary, in the TFT substrate and display panel thereof according to the invention, the source and the drain of the TFT are disposed on and respectively contact with the film layer of the TFT. The film layer corresponding to between the source and the drain has an arc concave portion, and the arc concave portion is formed after removing the reaction product by wet etching the source and the drain. Thus, the subsequent heat processes will not cause damage on the channel layer and influence device characteristics. In one embodiment, the film layer acts as the etching stop layer. In another embodiment, the film layer acts as the channel layer. Therefore, the TFT substrate and its display panel according to the invention have better device reliability and improved product yield.

BRIEF DESCRIPTION OF THE DRAWINGS

The embodiments will become more fully understood from the detailed description and accompanying drawings, which are given for illustration only, and thus are not limitative of the present invention, and wherein.

DETAILED DESCRIPTION OF THE INVENTION

The embodiments of the invention will be apparent from the following detailed description, which proceeds with reference to the accompanying drawings, wherein the same references relate to the same elements.

Figure 1:
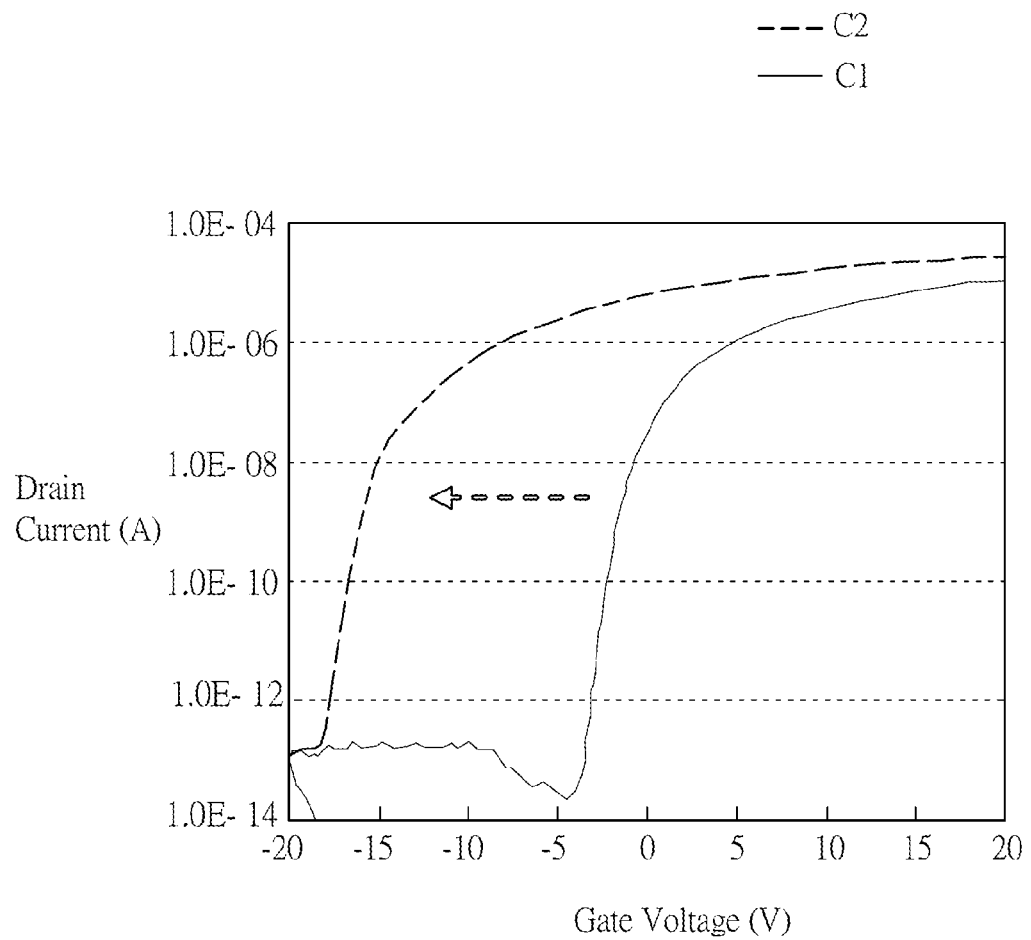
FIG. 1 is a schematic diagram showing characteristic curve of two kinds of TFTs.
Figure 2A:
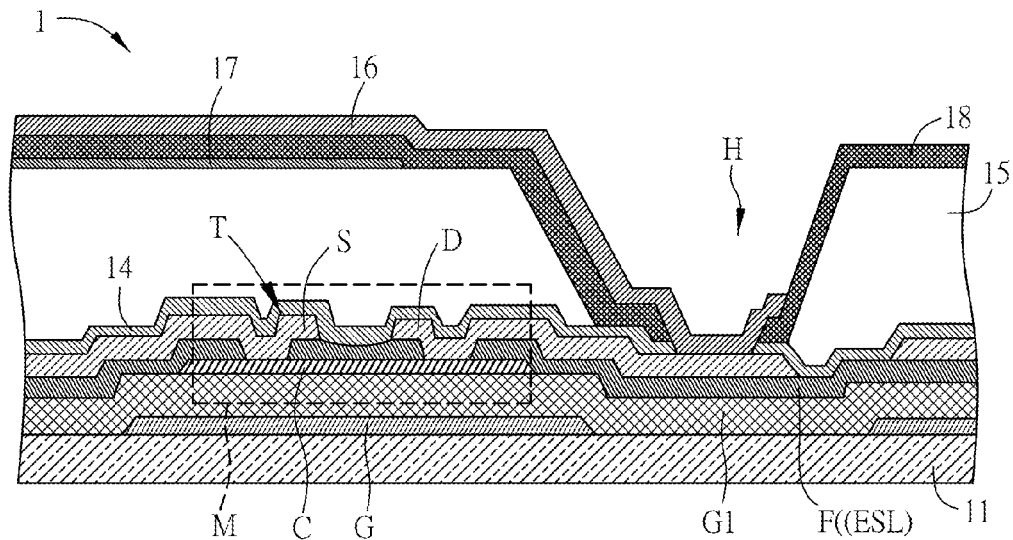
FIG. 2A is a sectional schematic diagram showing the TFT substrate according to the embodiment of the invention.
Figure 2B:
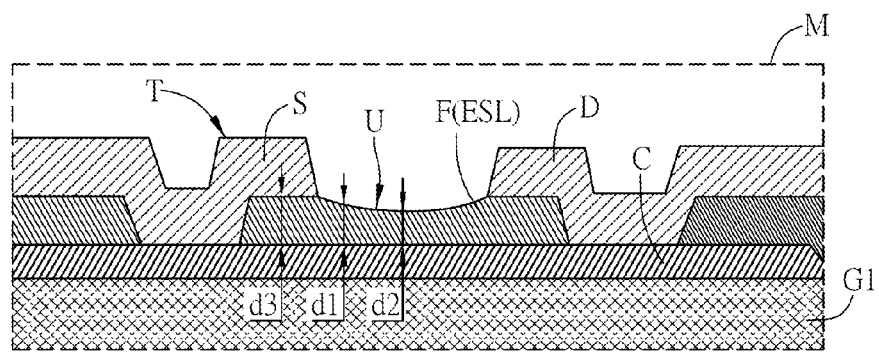
FIG. 2B is an enlarged schematic diagram showing a region of FIG. 2A.

Referring to FIG. 2A and FIG. 2B, FIG. 2A is a sectional schematic diagram showing a TFT (thin film transistor) substrate 1 according to the embodiment of the invention. FIG. 2B is an enlarged schematic diagram showing a region M of FIG. 2A. The TFT substrate 1 in the embodiment may be applied to the LCD (liquid crystal display) panel or OLED (organic light-emitting diode) display panel for example but not limited to.

The TFT substrate 1 includes a substrate 11 and a TFT T. Moreover, the TFT substrate 1 may further includes a first insulation layer 14, a planarization layer 15, a first electrode layer 16, a second electrode layer 17 and a second insulation layer 18. For the sake of clarity, in FIG. 2B, the region M does not show the first insulation layer 14 and the planarization layer 15.

The substrate 11 is made by transparent material, and for example but not limited to, it is a glass substrate, a quartz substrate or a plastic substrate. The TFT T is disposed on the substrate 11. Herein, TFT T acts as a switch element of a pixel and it has a gate G, a gate dielectric layer G1, a film layer F, a source S and a drain D. The gate G is disposed on the substrate 11, and the material of the gate G may be metal (for example, aluminum, copper, silver, molybdenum, or titanium) or a structure of single layer or multiple layers constituted of their alloy. Part wires for transmitting driving signals can employ the structure of the same layer and the same manufacturing process as the gate G do and electrically connect to each other, for example scan line (not shown in figure). The gate dielectric layer G1 is disposed on the gate G and the substrate 11, and the gate dielectric layer G1 may employ organic material such as organic silicon oxide compounds, or inorganic materials such as silicon nitride, silicon oxide, silicon oxide of nitrogen, silicon carbide, aluminum oxide, or hafnium oxide, or the structure of multiple layers of the above materials. The dielectric layer G1 is required to fully cover the gate G, and it can selectively partially or fully cover the substrate 11.

The film layer F is disposed on the gate dielectric layer G1, and the source S and the drain D are disposed on the film layer F and contact with the film layer F, respectively. There is an interval between the source S and the drain D. Herein, the term interval means that the source S does not connect to the drain D and they are apart from each other. The material of the source S and the drain D may be metal (for example, aluminum, copper, silver, molybdenum, or titanium) or a structure of single layer or multiple layers constituted of their alloy (for example the structure of the multiple layers is the multiple metal layers of molybdenum nitride/aluminum/molybdenum nitride). Part wires for transmitting driving signals can employ the structure of the same layer and the same manufacturing process as the source S and drain D do, for example data line (not shown in figure).

In addition, the film layer F corresponding to the interval has an arc concave portion U. In the embodiment, the film layer F acts as an etching stop layer ESL of the TFT T. Therefore, referring to FIG. 2B, the etching stop layer ESL corresponding to the drain D and the source S has the arc concave portion U. Besides, the TFT T in the embodiment further includes a channel layer C. The channel layer C is relative to the gate G and it is disposed on the gate dielectric layer G1. The etching stop layer ESL is disposed on the channel layer C. In the embodiment, the material of the channel layer C for example may include oxide semiconductor. Herein, the mentioned oxide semiconductor includes oxide, and the oxide includes at least one of the indium, gallium, zinc and tin, for example IGZO (indium gallium zinc oxide). Furthermore, the source S and the drain D are respectively disposed on the channel layer C, and the source S and the drain D respectively contact with the channel layer C. In the embodiment, one end of the source S and the drain D contact with the channel C respectively through an opening of the etching stop layer ESL. When the channel layer C of TFT T is not conducted, the source S and the drain D are electrically isolated. The etching stop layer ESL may employ organic material such as organic silicon oxide compounds, or single layer of inorganic materials such as silicon nitride, silicon oxide, silicon oxide of nitrogen, silicon carbide, aluminum oxide, or hafnium oxide, or the structure of multiple layers of the above materials, it is not limited thereto. Alternatively, in other embodiments, the source S and the drain D may be disposed directly onto the channel layer C and it no longer needs the etching stop layer ESL.

As to implementation, the etching stop layer ESL having the arc concave portion U can be obtained by one of the following two kinds of manufacturing processes. The first is that after the source S and the drain D are patterned by wet etching (namely etching the second metal layer (generally called M2) to form the source S and the drain D), the photoresist originally disposed on the source S and the drain D is currently not removed but applied to a dry etching (for example the etching gas is $SF_6$), and the subsequent processes are the same with the conventional. Because there is a photoresist on the source S and the drain D but there is not photoresist between the source S and the drain D, part of the etching stop layer ESL located at the interval between the source S and the drain D is etched. Less part of the etching stop layer ESL is etched as it is closer to the source S and the drain D, more part of the etching stop layer ESL is etched as it is farther from the source S and the drain D, and thus the arc concave portion U is accordingly formed. While controlling the time of dry etching, the removal quantity of the etching stop layer ESL is controlled. The removal is the reaction product by wet etching for defining the pattern of the source S and the drain D. Because the reaction product from the etching stop layer ESL by wet etching is removed, the subsequent heat processes will not cause damage on the channel layer C of oxide semiconductor.

Alternatively, the second is that after the source S and the drain D are patterned by wet etching, the photoresist on the source S and the drain D is removed. Then, a dry etching is performed once, and the subsequent processes are the same with the conventional. Herein, the source S and the drain D act as a hard mark. Thus, part of the etching stop layer ESL between the source S and the drain D is etched to form the arc concave portion U. The removal is the reaction product by wet etching for defining the pattern of the source S and the drain D. Because the reaction product from the etching stop layer ESL by wet etching is removed, the subsequent heat processes will not cause damage on the channel layer C of oxide semiconductor.

It is noted that when one part of the above etching stop layer ESL is removed to form the arc concave portion U, it is not limited to that the etching stop layer ESL at the interval only must have arc curve on its surface. In different embodiments, the surface of the etching stop layer ESL corresponding to the interval can be not only arc curve but also other shapes. For example, after one part of the etching stop layer ESL is removed, the etching stop layer ESL corresponding to the interval has an arc (arc curve) at its peripheral region (namely near the source S and the drain D), but the etching stop layer ESL corresponding to the interval is a flat region instead of the arc at its middle region. It is not only limited to the shape of FIG. 2B.

Besides, because the etching stop layer ESL corresponding to the interval between the source S and the drain D has the arc concave portion U (the middle of the arc concave portion U is lower, and its peripheral is higher), the thickness of the etching stop layer ESL at its peripheral region corresponding to the interval can be represented by a first thickness d1, the thickness of the etching stop layer ESL at its middle region corresponding to the interval can be represented by a second thickness d2, and the first thickness is thicker than the second thickness (d1>d2, namely the peripheral is thicker and the middle is thinner). In addition, because the source S and the drain D in the embodiment partly cover the etching stop layer ESL, contact regions respectively exist between the source S near the arc concave portion U and the etching stop layer ESL and between the drain D near the arc concave portion U and the etching stop layer ESL. The thickness of the etching stop layer ESL located at the contact region near the arc concave portion U can be represented by a third thickness d3, and the third thickness d3 is thicker than the first thickness d1 (d3>d1) thus d3>d1>d2. In addition, the difference between the third thickness d3 and the second thickness d2 is between 20 Å and 500 Å (20 Å≤(d3−d2)≤500 Å). In one embodiment, the first thickness d1 is for example 1900 Å, the second thickness d2 is for example 1800 Å, and the third thickness is for example 2000 Å.

In addition, referring to FIG. 2A again, the first insulation layer 14 is disposed on the source S and the drain D, and it covers the TFT T. Besides, the planarization layer 15 is disposed and covers the first insulation layer 14. Herein, the planarization layer 15 is disposed between the first insulation layer 14 and the second insulation layer 18. The material of the planarization layer 15 may be for example organic material, and for example but not limited to PFA (Polyfluoroalkoxy). The second electrode layer 17 is disposed on the planarization layer 15, and the second insulation layer 18 is disposed on and covers the planarization layer 15 and the second electrode layer 17. The material of the first insulation layer 14 and the second insulation layer 18 may be organic material, for example but not limited to a structure of single layer or multiple layers of silicon oxide (SiOx) or silicon nitride (SiNx).

The first electrode layer 16 is disposed on the second insulation layer 18. The first electrode layer 16 is filled in a through hole H of the planarization layer 15 and the first insulation layer 14 to connect the drain D. In the embodiment, the first electrode layer 16 for example acts as pixel electrode, and the second electrode layer 17 acts as common electrode. However, in different embodiments, the first electrode layer 16 may acts as common electrode, the second electrode layer 17 acts as pixel electrode, and they are not limited thereto. The material of the first electrode layer 16 and the second electrode layer 17 for example can be ITO (indium tin oxide), IZO (indium zinc oxide), AZO (aluminum zinc oxide), CTO (chrome tin oxide), tin oxide ($SnO_2$), Zinc oxide (ZnO), or other transparent conductive material.

Figure 3:
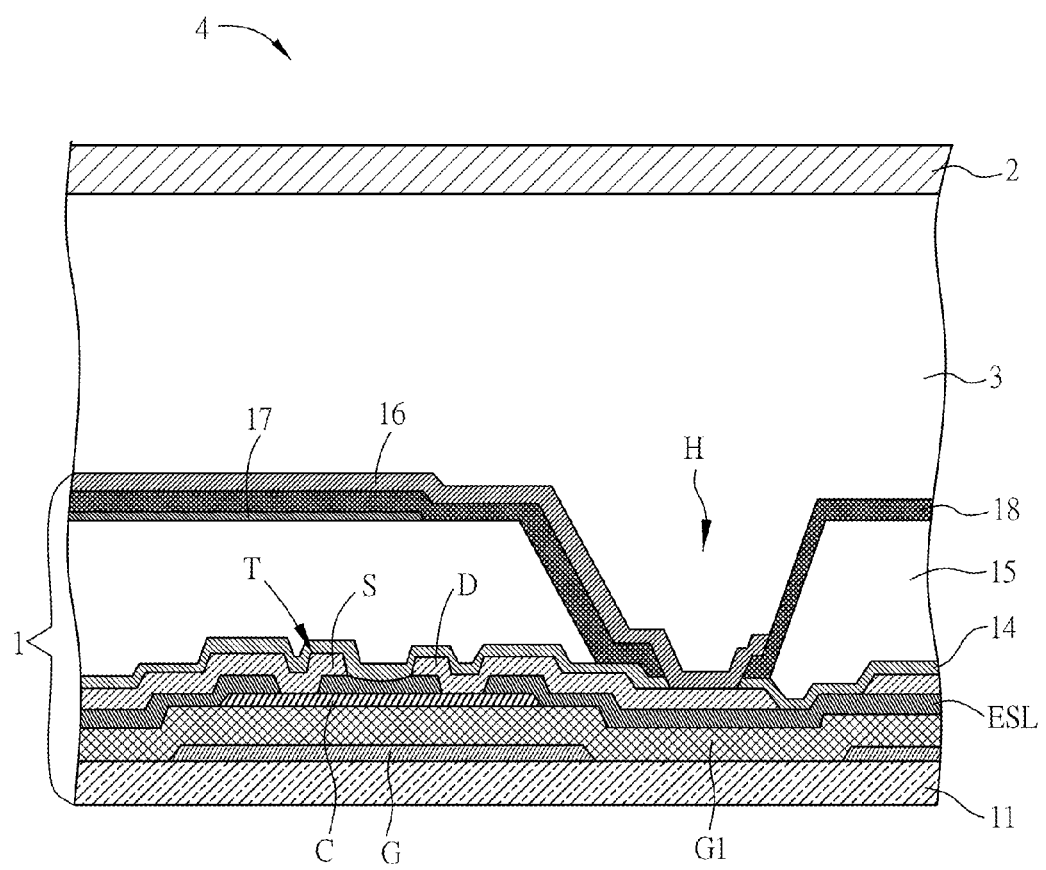
FIG. 3 is a sectional schematic diagram showing the display panel according to the embodiment of the invention.

In addition, referring to FIG. 3, it is a sectional schematic diagram showing a display panel 4 according to the embodiment of the invention. The display panel 4 in the embodiment is a LCD panel for example. Herein, the LCD panel can be FFS (Fringe Field Switching) LCD panel, IPS (In Plane Switching) LCD Panel, TN (Twisted Nematic) LCD panel or VA (Vertical Alignment) LCD panel. Here, the FFS LCD panel is taken for example.

The display panel 4 includes a TFT substrate 1, an opposite substrate 2 and a display layer 3. Because the TFT substrate 1 has been explained above and it can be referred to the previous description, and thus it is not repeated here. The substrate 11 of the TFT substrate 1 is disposed opposite to the opposite substrate 2. The opposite substrate 2 is also made by transparent material, and for example but not limited to, it is a glass substrate, a quartz substrate or a plastic substrate. In addition, the display layer 3 in the embodiment is a liquid crystal layer and it has a plurality of liquid crystal molecules (not shown in the figure). In another embodiment, when the display panel 4 is an OLED display panel, the display layer 3 can be a stack structure of OLED. Herein, the opposite substrate 2 can be a cover plate and it protects the organic light emitting layer from environment mist or pollution of foreign object.

Besides, the display panel 4 further includes a seal (not shown in the figure). The seal is disposed between the TFT substrate 1 and the opposite substrate 2, and it encloses the fringes of the TFT substrate 1 and the opposite substrate 2. The liquid crystal molecules can be filled in the accommodation space enclosed by the seal to form a LCD panel. For example but not limited to, ODF (One Drop Filling) can be performed to fill the liquid crystal molecules in the region enclosed by the seal.

Therefore, when a plurality of scan lines of the TFT substrate 1 receive a scan signal, the TFTs T corresponding to the respective scan lines are accordingly conducted, and a data signal corresponding to each row pixel is sent by a plurality of data lines to the first electrode layer 16 of the corresponding pixel. Thus, the display panel 4 can display image.

Figure 4A:
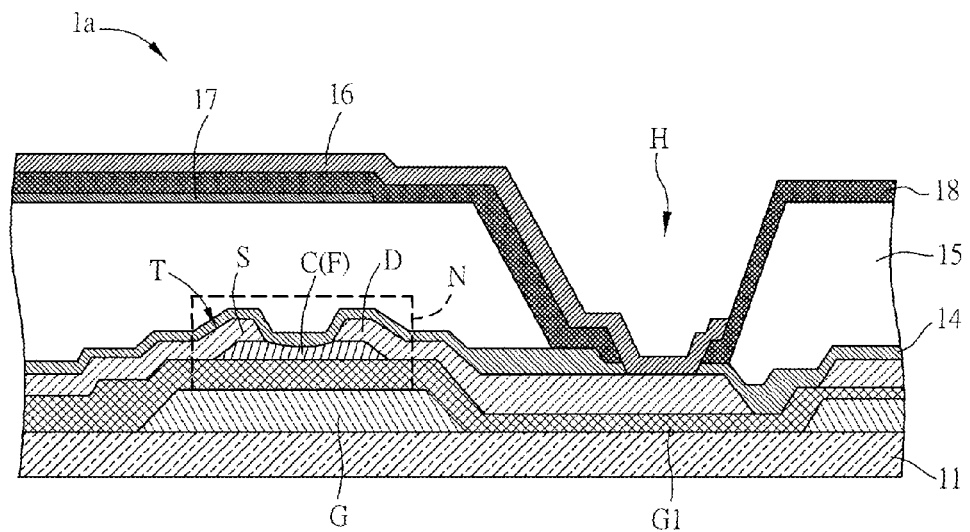
FIG. 4A is a sectional schematic diagram showing the TFT substrate according to another example of the embodiment of the invention.
Figure 4B:
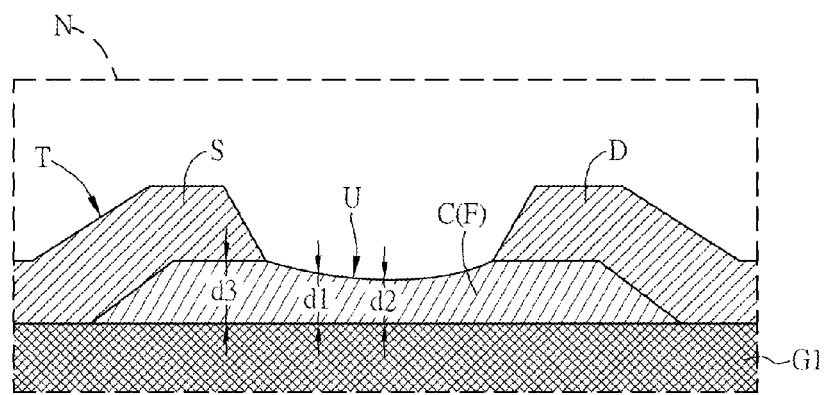
FIG. 4B is an enlarged schematic diagram showing a region of FIG. 4A.

In addition, referring to FIG. 4A and FIG. 4B, FIG. 4A is a sectional schematic diagram showing the TFT substrate 1a according to another example of the embodiment of the invention, and FIG. 4B is an enlarged schematic diagram showing a region N of FIG. 4A. For the sake of clarity, in FIG. 4B, the first insulation layer 14 and the planarization layer 15 are not shown.

The difference from the TFT substrate 1 is that the TFT substrate 1a does not have the etching stop layer ESL, and the film layer F acts as the channel layer C of the TFT T. Therefore, similarly, because the channel layer C corresponding to the interval between the source S and the drain D has the arc concave portion U (the middle of the arc concave portion U is lower, and its peripheral is higher), the thickness of the channel layer C at its peripheral region corresponding to the interval can be represented by a first thickness d1, the thickness of the channel layer C at its middle region corresponding to the interval can be represented by a second thickness d2, and the first thickness is thicker than the second thickness (d1>d2). In addition, because the source S and the drain D in the embodiment partly cover the channel layer C, contact regions respectively exist between the source S near the arc concave portion U and the channel layer C and between the drain D near the arc concave portion U and the channel layer C. The thickness of the channel layer C located at the contact region near the arc concave portion U can be represented by a third thickness d3, and the third thickness d3 is thicker than the first thickness d1 (d3>d1>d2). In addition, the difference between the third thickness d3 and the second thickness d2 is distinct from that of FIG. 2B, and the difference is between 50 Å and 300 Å (50 Å≤(d3−d2)≤300 Å). In one embodiment, the first thickness d1 is for example 450 Å, the second thickness d2 is for example 250 Å, and the third thickness is for example 500 Å.

Besides, other technical features of the TFT substrate 1a can be referred to the corresponding elements of the TFT substrate 1, and thus they are not repeated again.

Figure 5:
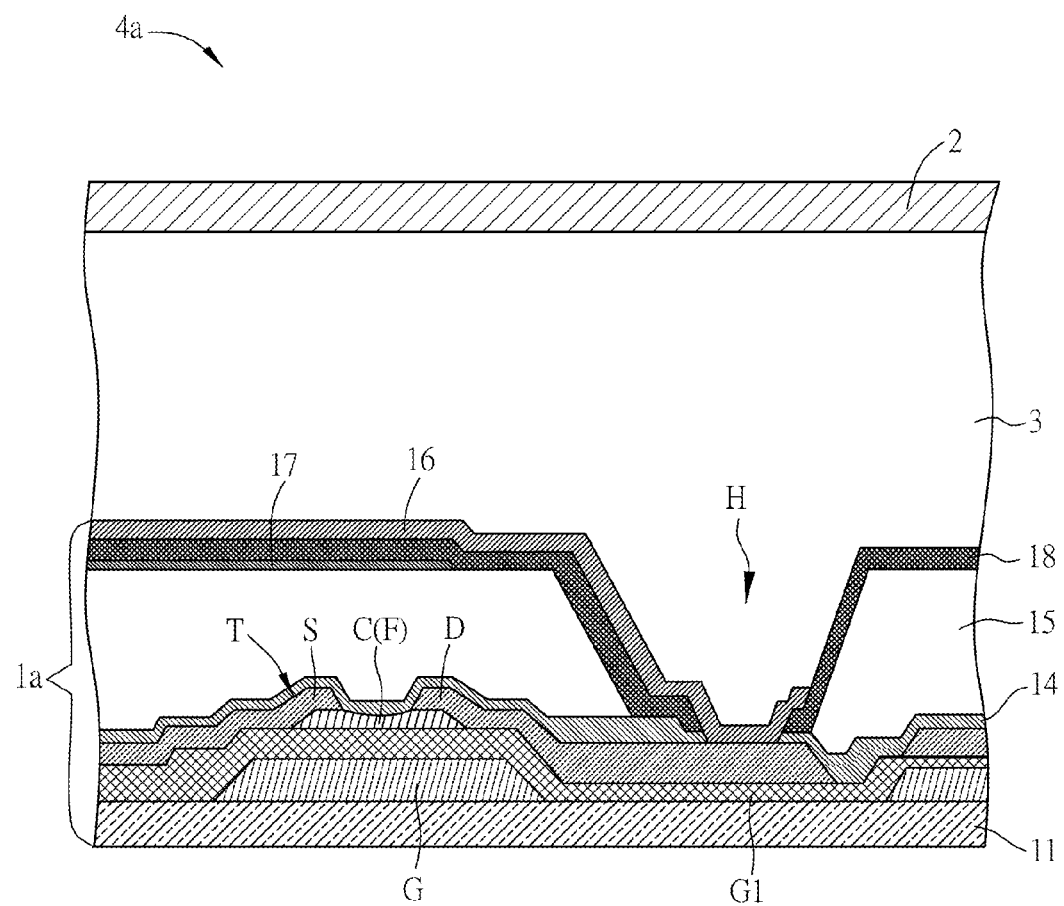
FIG. 5 is a sectional schematic diagram showing the display panel according to another example of the embodiment of the invention.

Besides, referring to FIG. 5, it is a sectional schematic diagram showing a display panel 4a according to another example of the embodiment of the invention. The display panel 4a in the embodiment is still a LCD panel for example.

The display panel 4a includes a TFT substrate 1a, an opposite substrate 2 and a display layer 3. Because the TFT substrate 1a, the opposite substrate 2 and the display layer 3 have been explained above and they can be referred to the previous description, and they are not repeated here.

Figure 6:
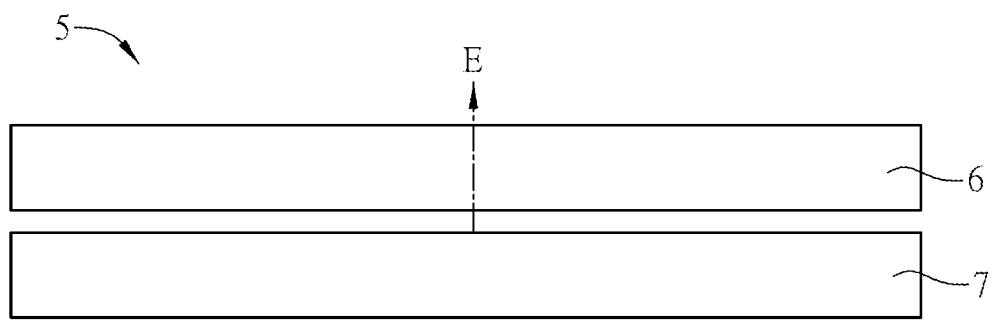
FIG. 6 is a schematic diagram showing the display device according to the embodiment of the invention.

Besides, referring to FIG. 6, it is a schematic diagram showing a display device 5 according to the embodiment of the invention.

The display device 5 includes a display panel 6 and a backlight module 7. The display panel 6 is disposed opposite to the backlight module 7. Herein, the display device 5 is an LCD device. The display panel 6 may employ one of the previous mentioned display panel 4, 4a, or their variations. Because detail technique contents can be referred to above, they are not repeated again here. When the light beam E from the backlight module 7 passes through the display panel 6, an image is formed by each pixel of the display panel 6 to display color.

In summary, in the TFT substrate and display panel thereof according to the invention, the source and the drain of the TFT are disposed on and respectively contact with the film layer of the TFT. The film layer corresponding to between the source and the drain has an arc concave portion, and the arc concave portion is formed after removing the reaction product by wet etching the source and the drain. Thus, the subsequent heat processes will not cause damage on the channel layer and influence device characteristics. In one embodiment, the film layer acts as the etching stop layer. In another embodiment, the film layer acts as the channel layer. Therefore, the TFT substrate and its display panel according to the invention have better device reliability and improved product yield.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A thin film transistor (TFT) substrate, comprising:
    a substrate; and
    a TFT, disposed on the substrate and having a gate, a gate dielectric layer, a film layer, a source and a drain, wherein the gate is disposed on the substrate, the gate dielectric layer is disposed on the gate, the film layer is disposed on the gate dielectric layer, the source and the drain are disposed on the film layer, and the source and the drain contact with the film layer respectively,
    wherein there is an interval between the source and the drain, and the film layer corresponding to the interval has a flat bottom surface and an arc concave upper surface;
    wherein a first thickness represents a thickness of peripheral region of the film layer corresponding to the interval, a second thickness represents a thickness of a middle region of the film layer corresponding to the interval, and the first thickness is thicker than the second thickness.

2. The TFT substrate of claim 1, wherein the film layer acts an etching stop layer of the TFT, the TFT further comprises a channel layer, the material of the channel layer is MOS disposed on the gate dielectric layer, and the etching stop layer is disposed on the channel layer.

3. The TFT substrate of claim 2, wherein the drain and the source contact with the channel layer respectively through an opening of the etching stop layer.

4. The TFT substrate of claim 1, wherein a contact region exists between the source/drain near the arc concave upper surface and the film layer, a third thickness represents a thickness of the film layer located at the contact region near the arc concave upper surface, and the third thickness is thicker than the first thickness.

5. The TFT substrate of claim 4, wherein the difference between the third thickness and the second thickness is between 20 Å and 500 Å.

6. The TFT substrate of claim 1, wherein the film layer acts as a channel layer of the TFT, and the material of the channel layer is MOS.

7. A display panel, comprising:
   a TFT substrate, comprising a substrate and a TFT, wherein the TFT is disposed on the substrate and has a gate, a gate dielectric layer, a film layer, a source and a drain, the gate is disposed on the substrate, the gate dielectric layer is disposed on the gate, the film layer is disposed on the gate dielectric layer, the source and the drain are disposed on the film layer, the source and the drain contact with the film layer respectively, there is an interval between the source and the drain, and the film layer corresponding to the interval has a flat bottom surface and an arc concave upper surface, a first thickness represents a thickness of peripheral region of the film layer corresponding to the interval, a second thickness represents a thickness of a middle region of the film layer corresponding to the interval, and the first thickness is thicker than the second thickness; and
   an opposite substrate, disposed oppositely to the TFT substrate.

* * * * *